United States Patent [19]

Miyamoto

[11] Patent Number: 4,608,592
[45] Date of Patent: Aug. 26, 1986

[54] SEMICONDUCTOR DEVICE PROVIDED WITH A PACKAGE FOR A SEMICONDUCTOR ELEMENT HAVING A PLURALITY OF ELECTRODES TO BE APPLIED WITH SUBSTANTIALLY SAME VOLTAGE

[75] Inventor: Takashi Miyamoto, Tokyo, Japan

[73] Assignee: NEC Corporation, Tokyo, Japan

[21] Appl. No.: 511,935

[22] Filed: Jul. 8, 1983

[30] Foreign Application Priority Data

Jul. 9, 1982 [JP] Japan ............................ 57-119306
Oct. 19, 1982 [JP] Japan ............................ 57-183205

[51] Int. Cl.$^4$ .................... H01L 39/02; H05K 5/00
[52] U.S. Cl. .............................. 357/80; 357/74; 174/52 FP
[58] Field of Search ............. 357/74, 78, 80; 174/52 R, 52 FP

[56] References Cited

U.S. PATENT DOCUMENTS 3,872,583  3/1975  Beall et al. .................. 357/80
3,908,185  9/1975  Martin ....................... 357/74
4,067,040  1/1978  Tsuzuki et al. ............... 357/74

FOREIGN PATENT DOCUMENTS 31672  3/1977  Japan ....................... 357/74
36468  4/1978  Japan ....................... 357/74

*Primary Examiner*—William L. Sikes
*Assistant Examiner*—Frank González
*Attorney, Agent, or Firm*—Burns, Doane, Swecker and Mathis

[57] ABSTRACT

The present invention relates to a semiconductor device including a package for carrying a semiconductor element or chip having a plurality of components, such as transistors, diodes, etc. to which substantially the same voltage is to be applied. The voltage may be supplied to a plurality of electrodes distributed on the semiconductor element. Excessive voltage drop between the components and external leads of the device is inhibited by providing a package with at least one low resistance conductive layer about the periphery of the device which is electrically connected to an external lead of the device and to a plurality of electrodes on the semiconductor element.

13 Claims, 7 Drawing Figures

SEMICONDUCTOR DEVICE PROVIDED WITH A PACKAGE FOR A SEMICONDUCTOR ELEMENT HAVING A PLURALITY OF ELECTRODES TO BE APPLIED WITH SUBSTANTIALLY SAME VOLTAGE

BACKGROUND OF THE INVENTION

The present invention relates to a semiconductor integrated circuit device, and more particularly to a package for a semiconductor element (or die) having a plurality of electrodes to be applied with substantially the same voltage.

A semiconductor integrated circuit device is assembled by mounting a semiconductor element in a package and wiring electrodes of the semiconductor element with lead terminals provided on the package and connected to external leads which are in turn attached to the package. The semiconductor element provides a large number of active elements such as transistors and diodes and passive elements such as resistors and capacitors within one semiconductor chip which are interconnected by a metal layer deposited thereon in accordance with the required circuit function.

Due on the increasing commercial demands to semiconductor integrated devices for additional functions and enhancement of signal processing capability, the number of active and passive elements formed in one semiconductor chip, (that is, the integration density) is being increased, resulting in the increase in size of the semiconductor chip. Further, in order to operate at a high speed of signal processing, the amplitude of the signals processed by the integrated circuit device is lowered. In other words, a noise margin is reduced.

The increase in integration density or in size of the semiconductor chip enlarges the length of wiring layer and causes a potential shift of an actuating voltage such as a power supply voltage or the ground potential. Such a potential shift may cause a mulfunction of the circuit. In more detail, the integrated circuit device receives the power voltage along with the signals to be processed to actuate the active and/or passive circuit elements. The power voltage is generally supplied to one electrode of the semiconductor chip through one external lead provided on the package. This electrode is connected to the circuit elements requiring the power voltage via a wiring layer deposited on the semiconductor chip. The increase in the integration density increases the number of wirings for interconnecting circuit elements. That is, the wiring density is increased. Consequently, the wiring layer for connecting the electrode on the chip for receiving the power voltage (hereinafter called "power voltage electrode") to the circuit elements is compelled to become narrow and thin. In addition, the increase in size of the semiconductor chip elongates the length of the wiring layer, resulting in increase of the impedance of the wiring layer. As a result, a voltage different from that at the power voltage electrode is actually supplied to the circuit elements. In other words, the potential shift occurs. This potential shift causes a malfunction of circuit because the noise margin is small for the purpose of high processing speed. The same phenomena sometimes occur in the wiring layer for ground potential.

The aforementioned potential shift can be suppressed by providing a plurality of power voltage electrodes on the semiconductor chip. For instance, four power voltage electrodes are provided on the respective four edges of the semiconductor chip of a rectangular shape. In this manner, the circuit elements can receive the power voltage from the nearest power voltage electrode depending upon the disposed positions of the respective elements within the semiconductor chip. Accordingly, the lengths of the wiring layers connecting the power voltage electrodes to the circuit elements are shortened, resulting in the decrease in impedances of the wiring layers.

However, the formation of a plurality of the power voltage electrodes causes the increase in number of external leads. For instance, the provision of four power voltage electrodes necessitates four external leads. In other words, three extra external leads may additionally be required as compared to the conventional devices. An increase in number of the external leads enlarges the package, resulting in an expensive device. If the integrated circuit chip having a plurality of power voltage electrodes is mounted within a package whose external leads are predetermined in number, the number of external lead terminals for receiving signals to be processed and for deriving processed signals is reduced. Consequently, it is actually impossible to increase the integration density and/or the number of functions.

SUMMARY OF THE INVENTION

It is, therefore, one object of the present invention to provide a semiconductor integrated circuit device providing a package suitable for a semiconductor element having a plurality of electrodes to be applied with the substantially same voltage.

Another object of the present invention is to provide a semiconductor integrated circuit device, in which the substantially same voltage is supplied to a plurality of electrodes of a semiconductor element through one or more external leads, the number of which is less than the number of electrodes.

A semiconductor integrated circuit device according to the present invention comprises a package including a stem body having a central portion on one surface. An annular conductive layer is formed on the stem body and surrounds the central portion. At least one first external leads is formed on the stem body and electrically connected to the annular conductive layer and a plurality of second external leads are electrically isolated from the annular conductive layer. A semiconductor element having a first group of electrodes and a second group of electrodes is mounted on the central portion of the stem body. First connection paths electrically connect the first group of electrodes of the semiconductor element to the annular conductive layer, and second connection paths electrically connect each of the electrodes in the second group of electrodes of the semiconductor element to each of the second external leads. The number of electrodes in the first group connected to the annular conductive layer is greater than the number of first external leads.

The semiconductor element provides a plurality of electrodes electrically connected to the annular conductive layer to suppress the aforementioned potential shift, and therefore, it is preferable to supply the actuating voltage such as the ground potential or the power supply voltage thereto. The annular conductive layer is electrically connected to the first external lead, the number of which is smaller than that of the electrodes connected to the annular conductive layer. Accordingly, the annular conductive layer takes a voltage substantially equal to that supplied to the first external lead.

As a result, the voltage of the annular conductive layer is supplied through the first connection paths to the plurality of electrodes of the semiconductor elements. Thus, by providing the annular conductive layer, a plurality of electrodes of the semiconductor element are supplied with the substantially same voltage, respectively, through one external lead or leads which are less in number than the electrodes.

It is preferable to use a package formed by integrally combining a plurality of insulative sheets as a package for the semiconductor integrated circuit device according to the present invention. In such a package, at least one conductive layer can be formed on the respective insulative sheets, so that a plurality of conductive layers separated from one another are formed in the package. Therefore, the package having the annular conductive layer electrically connected to the first external lead and electrically insulated from the second external leads can be easily manufactured without any short-circuit. Moreover, two or more annular conductive layers electrically insulated from each other can be formed in the package of this type. Therefore, two or more actuating voltages can be supplied to two or more annular conductive layers, respectively. In other words, the potential shifts of all the acutuating voltages are suppressed.

BRIEF DESCRIPTION OF THE DRAWINGS

These and other objects, features and advantages of the present invention will become more apparent by reference to the following description of preferred embodiments of the invention taken in conjunction with the accompanying drawings, wherein.

DETAILED DESCRIPTION OF THE PREFERRED EMBODIMENTS

Figure 1:
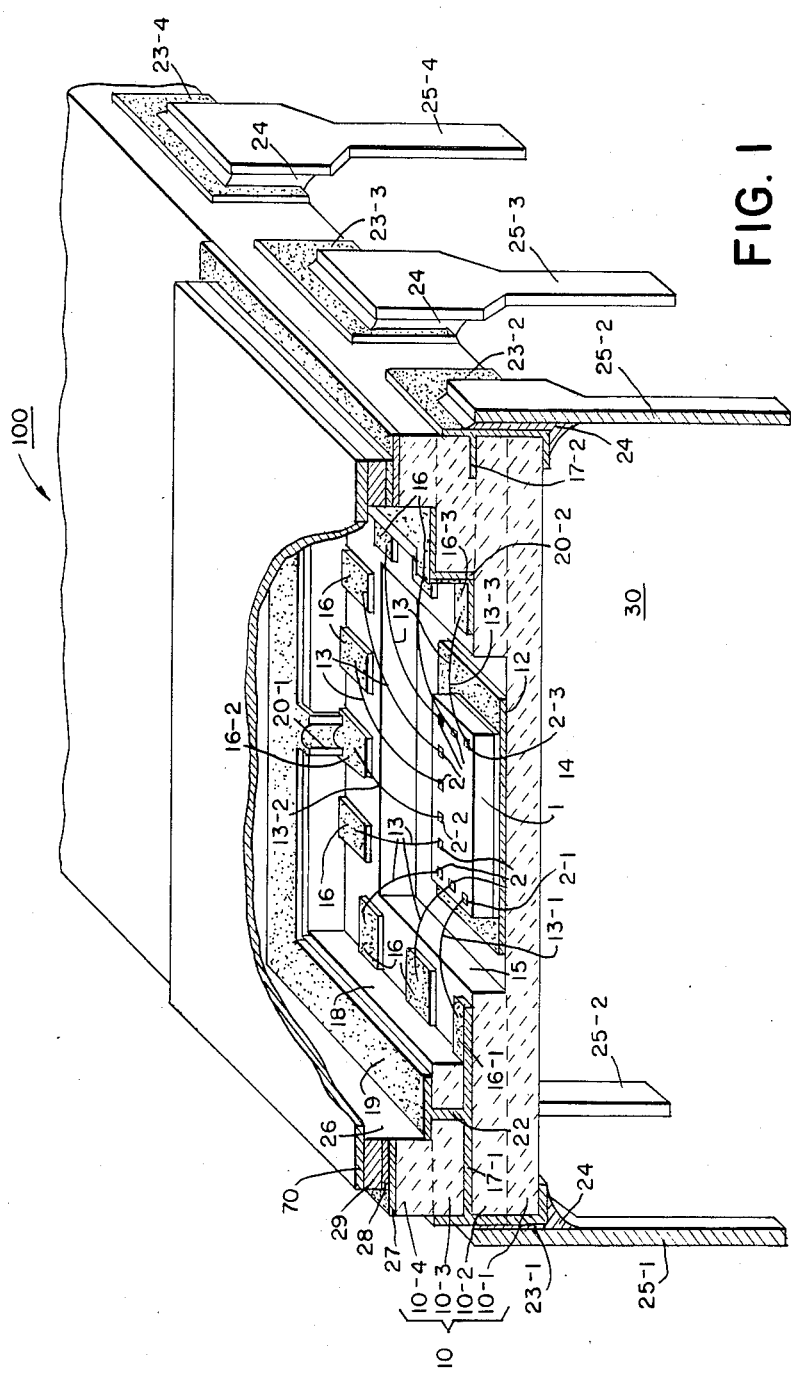
FIG. 1 is an internal perspective view showing a first preferred embodiment of the present invention.

A first preferred embodiment of the present invention will be described with reference to FIG. 1. The illustrated semiconductor integrated circuit device 100 is assembled by mounting a semiconductor element 1 in a package 30 provided with a plurality of external leads 25-1, 25-2, . . . 25-5 and a hermetically sealing metal lid 70. Thus, the semiconductor element 1 is separated from an external atmosphere.

The semiconductor element or chip 1 has a rectangular semiconductor body of, for example, silicon, and a large number of active and passive elements (not shown) formed therein. In order to supply signals to be processed to the chip 1 and to derive processed signals from the chip 1, there are provided a large number of electrodes 2. Furthermore, the chip 1 has electrodes 2 supplied with a power supply voltage (hereinafter called "power supply electrode") for activating the respective circuit elements formed therein. At least one power supply electrode is provided along each of four edges of the chip 1 in order to suppress the aforementioned potential shift. In this embodiment, four power supply electrodes 2-1 to 2-4 are provided. It is to be noted that the power supply electrode 2-4 is not shown because of the partly cut away illustration.

The package 30 has a ceramic base 10 formed by superposing four unsintered alumina ceramic sheets 10-1 to 10-4 and integrally combining them through sintering. On the first ceramic sheet 10-1 is formed a tungsten metallized layer 12 called "island layer". The metallized layer 12 has an approximately rectangular shape of 7.6 mm × 8.0 mm which is larger than the area of the semiconductor chip 1. The width, length and thickness of the sheet 10-1 are 15.1 mm, 60.1 mm and 1 mm, respectively. The semiconductor chip 1 is mounted on the layer 12 with brazing material 14 such as a gold-silicon eutectic alloy so that their centers may substantially coincide with each other. Alternatively, a gold layer is formed on the island 12 by plating, and thereafter the chip 1 is mounted on the layer 14 by annealing to produce a gold-silicon eutectic alloy layer 14 between the chip 1 and the gold layer. The second ceramic sheet 10-2 has a hole 15 of 8.4 mm × 8.4 mm in size and the thickness of 0.64 mm. The third and fourth ceramic sheets 10-3 and 10-4 also have a hole 18 of 10.4 mm × 10.4 mm in size and a hole 26 of 12.0 mm × 12.0 mm in size, respectively. The thicknesses of the third and fourth sheets 10-3 and 10-4 are 0.3 mm and 0.5 mm, respectively. The centers of the respective holes 15, 18 and 26 and the center of the island 12 substantially coincide with one another. The width and length of the respective sheets 10-2 to 10-4 are equal to those of the sheet 10-1.

The ceramic sheet 10-2 provides a large number of connection terminals 16 on its surface exposed by the hole 18. Among the connection terminals 16, is included four connection terminals 16-1 to 16-4 which are connected to the power supply electrodes 2-1 to 2-4 via bonding wires 13-1 to 13-4 made of gold or aluminium. Here, the wire 13-4 and the terminal 16-4 are omitted from illustration. The other connection terminals 16 are also connected to the electrodes 2 via bonding wires 13. The respective connection terminals 16 are made of a metallized layer of tungsten. The connection terminal 16-1 connected to the power supply electrode 2-1 is led out to the outside of the base 10 through an internal wiring layer 17-1 formed between the sheets 10-2 and 10-3. However, as will be apparent from FIG. 1, other connection terminals 16-2 to 16-4 connected to the other power supply electrodes 2-2 to 2-4 are not directly led out, but are led out through an annular conductive layer 19 which will be explained thereafter. The remaining connection terminals 16 connected to the electrodes 2 other than the power supply electrodes 2-1 to 2-4 are lead out to the outside of the base 10 through other internal wiring layers 17, respectively. However, FIG. 1 shows only the internal wiring layer 17-1 extending from the connection terminal 16-1 and a part of another internal wiring layer 17-2 extending from another connection terminal 16 other than the terminals 16-2 to 16-4. The respective internal wiring layers 17 are also made of metallized layers of tungsten and formed simultaneously with formation of the connection terminals 16.

The ceramic sheet 10-3 is provided with the aforementioned annular conductive layer 19 on its surface portion exposed by the hole 26 and opposite to its contacting surface with the sheet 10-2. This annular conductive layer 19 is also formed as a metallized layer of tungsten. On the side surface of the sheet 10-3 formed by the hole 18, three tungsten metallized layers 20-1 to 20-3 are selectively formed. Here, the metallized layer 20-3 is not shown because it is formed on the side surface opposite to that on which the layer 20-1 is formed. These metallized layer 20-1 to 20-3 are extended from the annular conductive layer 19 to the connection terminals 16-2 to 16-4 to attain the electrical connection therebetween, respectively. This annular conductive layer 19 is further connected via a through-hole 22 provided in the sheet 10-3 to the internal wiring layer 17-1 leading out from the connection terminal 16-1 to the outside. Accordingly, the connection terminals 16-2, 16-3 and 16-4 connected to the power supply electrodes 2-2, 2-3 and 2-4 are led out to the outside of the base 10 through the annular conductive layer 19 and the internal wiring layer 17-1. The internal wiring layer 17-1 is connected to a tungsten metallized layer 23-1 formed on the side of the ceramic base 10. The metallized layer 23-1 is extended to a part of the bottom surface of the base 10. Other internal wiring layers 17 (containing the layer 17-2) are also respectively connected to tungsten metallized layers 23 (three layers 23-2 to 23-4 along with the layer 23-1 being shown) which are formed from the side of the ceramic base 10 to its buttom surface. External leads 25 (five leads 25-1 to 25-5 being shown) are connected to the metallized layers 23 by brazing material 24 such as a silver-copper eutectic alloy or a tin-lead alloy solder.

A power supply voltage to the integrated circuit device 100 is supplied to the external lead 25-1. The lead 25-1 is electrically connected to the power supply electrode 2-1 via the internal wiring layer 17-1, the connection terminal 16-1 and the bonding wire 13-1. The lead 25-1 is further connected to the other power supply electrodes 2-2 to 2-4 via the through-hole 22, the annular conductive layer 19, the metallized layer 20-1 to 20-3, the connection terminals 16-2 to 16-4 and the bonding wires3-2 to 3-4. Therefore, the power supply voltage applied to one external lead 25-1 is supplied to four electrodes 2-1 to 2-4 of the semiconductor chip 1, respectively. In other words, a plurality of electrodes of the semiconductor chip 1 is supplied with the substantially same voltage through one external lead 25-1.

The annular conductive layer 19 surrounds the semiconductor chip 1. Accordingly, even if the position of the respective power supply electrodes or the number of the power supply electrodes is changed, the annuar conductive layer 19 and the respective power supply electrodes are electrically connected with each other without any electrical short circuit to other electrodes. The annular conductive layer 19 is formed on the third ceramic sheet 10-3, and the connection terminals 16 and the internal wiring layers 17 are formed on the second ceramic sheet 10-2. Hence, there is no interference between the configurations of the conductive layers on the sheets 10-2 and 10-3.

The connection terminals 16-2 to 16-4 (the terminal 16-4 being not shown) may be connected to the annular conductive layer 19 by the bonding wires in place of the metallized layers 20. It is also possible to connect the connection terminals 16-2 to 16-4 to the annular conductive layer 19 via through-holes, respectively. The connection terminal 16-2 and the annular conductive layer 19 may be connected with each other via a metallized layer formed on the side surface of the sheet 10-3 or a bonding wire in place of the through-hole 22. The voltage drops between the terminals 16-1 to 16-4 and the electrodes 2-1 to 2-4 caused by the impedance of the bonding wires 13 are decreased by using two or more bonding wires, respectively. When there is a margin in the number of external lead terminals, two external lead wires could be connected to the annular conductive layer 19.

The fourth ceramic sheet 10-4 has a tungsten metallized layer 27 on its surface opposite to the sheet 10-3. A seal ring 29 made of an alloy of Fe, Ni and Co is connected to the metallized layer 27 by a silver-copper eutectic brazing material 28. The hermetic seal is effected between the seal ring 29 and the metal lid 70, and thereby the semiconductor chip 1 can be shielded from the external atmosphere.

The semiconductor integrated circuit device 100 shown in FIG. 1 is formed in the following way. At first, four unsintered alumina ceramic sheets 10-1 to 10-4 are prepared. The first sheet 10-1 is subjected to the tungsten metallization to form the island layer 12. The tungsten metallization is effected by selectively printing with ink containing tungsten. The thickness of the metallized layer is 20 to 30 $\mu$m. After making the hole 15 or before doing it in the second sheet 10-2, the tungsten metallization is attained to form the connection terminals 16 and the internal wiring layers 17 on the sheet 10-2, respectively. In the process of preparation of the third sheet 10-3, a small hole for the through-hole 22 and three large holes for the side surface metallized layers 20 are picked in the sheet 10-3, and the tungsten powder is then packed in the small hole. Next, the annular conductive layer 19 is formed by the tungsten metallization, and simultaneously, the tungsten ink is poured into the respective large holes. Thereafter, stamping of the hole 18 is effected. After the hole 26 is made in the fourth sheet 10-4, the tungsten metallized layer 27 is formed. The layer 27 may be formed before making the hole 26. The unsintered alumina ceramic sheets 10-1 to 10-4 processed in the above-described manner are registered and stacked with each other. Thereafter, the respective metallized layers 23 extending from the side surface of the base 10 to a part of the bottom surface are formed to make contact with the respective wiring layers 17. Subsequently, the heat treatment is carried out at 1500° C. to 1600° C. for about ten hours to sinter the respective ceramic sheets 10-1 to 10-4. Consequently, the ceramic base 10 having predetermined metallized conductor layers is formed.

In order to connect the respective external leads 25 and the seal ring 29, the nickel plating is effected at least on the metallized layers 23 and 27. The external leads 25 and the seal ring 29 are then bonded to the metallized layers 23 and 27 by means of silver-copper eutectic alloy material 24 and 28, respectively. The temperature upon this brazing is about 850° C. For the purpose of, for example, the prevention of oxidation, a nickel layer (2 to 4 $\mu$m) and a gold layer (2 $\mu$m) are plated on all the exposed conductor surfaces.

Thereafter, the semiconductor element 1 is mounted on the island layer 12 in the above-mentioned manner, and the respective electrodes 2 of the chip 1 are connected to the connection terminals 16 by bonding wires 13, respectively. The method of bonding could be either thermocompression bonding or supersonic bonding. Finally, the metal lid 70 is placed on the seal ring 29 and the hermetic seal therebetween is completed.

In place of the metal lid 70, a ceramic cap could be employed. In this case, the ceramic cap is bonded on the fourth sheet 10-4 by low melting point glass, for instance, solder glass having a 380° C. melting point. Alternatively, the lid 70 may be bonded on the metallized layer 27 by low melting point solder, for example, gold-tin eutectic alloy.

Figure 2:
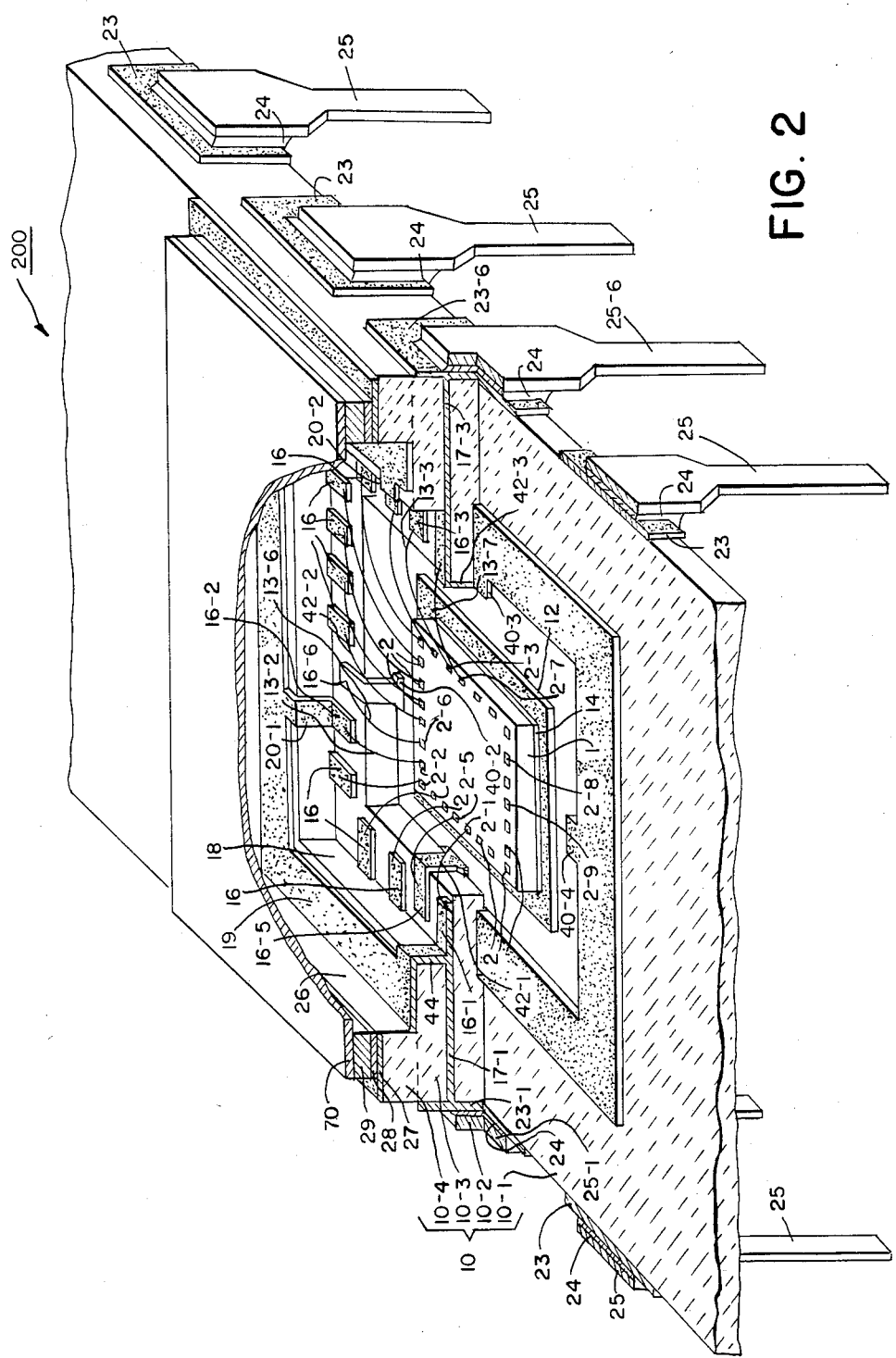
FIG. 2 is an internal perspective view showing a second preferred embodiment of the present invention.

The integrated circuit device 100 illustrated in FIG. 1 has one annular conductive layer (i.e. the layer 19). In semiconductor integrated circuit devices, it is often required to suppress not only the potential shift of the power supply voltage but also that of the ground potential. A semiconductor integrated circuit device which satisfies this requirement is illustrated in FIG. 2. In FIG. 2, the same constituents as those shown in FIG. 1 are denoted by like reference numerals to omit further explanations thereof.

The semiconductor chip 1 shown in FIG. 2 further has four electrodes 2-5 to 2-8 supplied with the ground potential (hereinafter called "ground electrode"). On the other hand, one external lead 25-6 is provided for supplying the ground potential. In order to apply the ground potential from one external lead 25-6 to four ground electrodes 2-5 to 2-8, a second annular conductive layer 40 is provided. This annular conductive layer 40 is formed on the first ceramic sheet 10-1 simultaneously with the formation of the island layer 12 by the tungsten metallization, and it surrounds the perpheries of the semiconductor chip 1 and the island layer 12. Accordingly, the second annular conductive layer 40 is isolated from the first annular conductor layer 19 by the second and third sheets 10-2 and 10-3.

Four ground electrodes 2-5 to 2-8 of the semiconductor chip 1 are connected to four connection terminals 16-5 to 16-8 through bonding wires 13-5 to 13-8, respectively. These connection terminals 16-5 to 16-8 are formed on the second sheet 10-2 simultaneously with the other connection terminals 16. The bonding wire 13-8 and the connection terminal 16-8 are not shown in FIG. 2 because of the partly cut away illustration. The annular conductive layer 40 has four projected portions 40-1 to 40-4 in order to obtain the electrical connections to the connection terminals 16-5 to 16-8. The projected portions 40-1 to 40-4 and the connection terminals 16-5 to 16-8 are connected with each other through four metallized layers 42-1 to 42-4 not (the layer 42-4 being shown), respectively. The metallized layers 42-1 to 42-4 are formed on the side surface of the sheet 10-2. The through-holes may be used to connect the annular conductive layer 40 and the connection terminals 16-5 to 16-8. Accordingly, the connection terminals 16-5 to 16-8 are supplied with a potential substantially equal to that supplied to the second annular conductive layer 40, respectively.

Among four ground connection terminals 16-5 to 16-8, only one ground connection terminal 16-7 is directly led out to the outside of the base 10 through an internal wiring layer 17-3 which is formed simultaneously with the other internal wiring layers 17. The internal wiring layer 17-3 is connected to the side surface metallized layer 23-6 of the base 10, to which a grounding external lead 25-6 is connected by silver-copper eutectic brazing material 24. Consequently, the ground potential is applied to all of the four ground electrodes 2-5 to 2-8 by grounding the external lead 25-6. In other words, the substantially same potential is applied to a plurality of electrodes of the semiconductor chip 1 through one external lead, respectively.

The power supply electrodes 2-1 to 2-4 of the semiconductor chip 1 are applied with the power supply voltage from one external lead 25-1 through the first annular conductor layer 19, respectively. It is to be noted that the connection terminal 16-1 is connected to the annular conductive layer 19 by a side surface metallized layer 44 in place of the through-hole 22 in FIG. 1.

Also in the second preferred embodiment shown in FIG. 2, modifications similar to those described in connection to the first preferred embodiment in FIG. 1 are possible. The semiconductor chip often requires the power supply voltage or the ground potential in order to bias its semiconductor body. In this case, it is preferable to supply a bias voltage to the semiconductor body of the chip 1 from the island layer 12. Accordingly, the island layer 12 may be connected to the annular conductive layer 40 or the connection terminals 16-1 to 16-4 by use of a metallized layer.

Thus, in the semiconductor circuit device 200 shown in FIG. 2, the ground potential and the power supply voltage are applied to the respective grounding electrodes 2-5 to 2-8 and to the respective power supply electrodes 2-1 to 2-4 from one ground external lead 25-6 and one power supply external lead 25-1, respectively.

Figure 3:
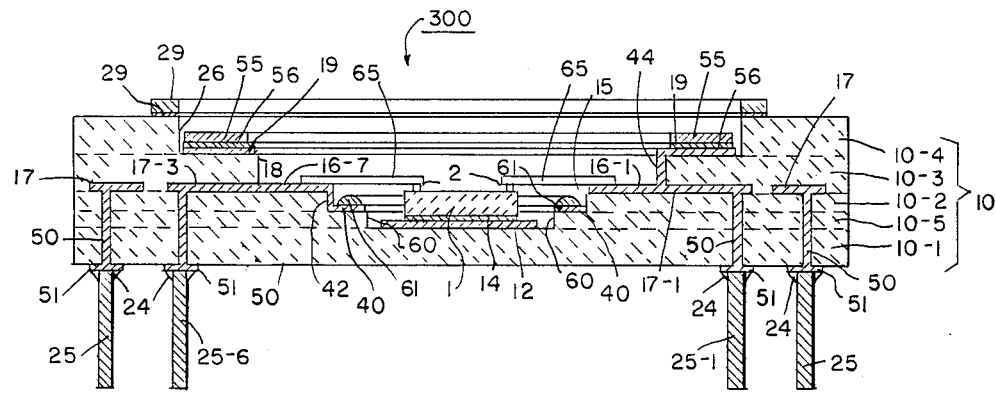
FIG. 3 is a cross-sectional view showing a third preferred embodiment of the present invention.

The first and second annular conductive layers 19 and 40 are formed by the tungsten metallization and have a thickness of 20 to 30 $\mu$m, respectively, as illustrated hereinbefore. For this reason, resistances of these annular conductive layers 19 and 40 may be increased due to the enlargement of their lengths caused by the increase in size of the semiconductor chip 1. As a result, the voltage drops across the annular conductive layers 19 and 40 become large. A semiconductor integrated circuit device having an improvement in resistance of the annular conductive layer is illustrated in FIG. 3. In this figure, the constituents identical to those shown in FIG. 2 are denoted by like reference numerals to omit further descriptions thereof.

The semiconductor integrated circuit device 300 shown in FIG. 3 is of the so-called plug-in type or pin grid array type, in which a plurality of external leads 25 are led out from the bottom of the ceramic base 10 in columns of four. More particularly, the internal wiring layers 17 extending from the respective connection terminals 16 are connected to metallized layers 51 formed on the bottom surface of the base 10 via through-holes 50, respectively. External leads 25 are vertically connected to the bottom surface metallized layers 51 by a brazing material 24 of silver-copper eutectic alloy or tin-lead solder.

In order to lower the resistance of the annular conductive layer 19 applied with the power supply voltage, a metallic member 55 made of copper and having an annular shape is mounted on the annular conductor layer 19 with brazing material 56. Consequently, the thickness of the annular conductive layer 19 is made thicker, resulting in a low resistance. Silver-copper eutectic brazing material is selected as the brazing material 56, and therefore the metallic member 55 is mounted in the same step of connecting the external leads 25. As an alternative, the connections can be made with low melting point brazing material 56 such as a tin-lead solder.

For the purpose of lowering the resistance of the annular conductive layer 40 supplied with the ground potential, an additional alumina ceramic sheet 10-5 is interposed between the ceramic sheets 10-1 and 10-2, and the annular conductive layer 40 is formed on this ceramic sheet 10-5. In the embodiment shown in FIG. 2, the annular conductive layer 40 is covered with the sheet 10-2, and therefore its thickness cannot be made thick. Accordingly, the ceramic sheet 10-5 having a hole 60 of the size slightly larger than that of the island layer 12 and smaller than the hole 15 of the ceramic sheet 10-2, is interposed between the ceramic sheets 10-1 and 10-2. The annular conductive layer 40 is formed on a surface portion of the sheet 10-5 which is not covered with the sheets 10-1 and 10-2. Further, a layer of a brazing material 61 is coated over the annular conductive layer 40 to reduce the resistance of the layer 40. By selecting silver-copper eutectic alloy for the brazing material 61, the coating of the brazing material layer 61 can be formed simultaneously with the step of connecting the external leads 25 by the brazing material 24 of silver-copper eutectic alloy. More particularly, five unsintered ceramic sheets 10-1 to 10-5 which are selectively subjected to the tungsten metallization are superposed, and these ceramic sheets are integrally combined by sintering. A silver-copper eutectic alloy frame having the approximately same shape as the annular conductive layer 40 is stamped out from a silver-copper eutectic alloy plate, and the stamped frame is superposed on the annular conductive layer 40. By making use of the heat-treatment for connecting the external leads 25 to the bottom surface metallized layers 51, the stamped frame of silver-copper eutectic alloy is melted to coat the layer 40 with the brazing material 61. A low melting point brazing material such as a tin-lead solder may be employed for the brazing materials 61 and 24. Likewise, in place of the copper frame 55, the coating of the brazing material may be formed on the annular conductive layer 19. On the contrary, a copper frame may be attached on the annular conductor layer 40.

The semiconductor integrated circuit device 300 in FIG. 3 has the following additional difference as compared to the device shown in FIG. 2. That is, the respective electrodes 2 of the semiconductor chip 1 are not connected through bonding wires to the respective connection terminals 16 but are connected through a tape carrier 65. The tape carrier 65 has a plurality of copper foils selectively formed on an insulator sheet made of polyimide or the like. The tape carriers 65 are also applicable to the semiconductor integrated circuit devices shown in FIGS. 1 and 2.

Thus, the semiconductor integrated circuit device 300 shown in FIG. 3 further improves the potential shifts of the power supply voltage and the ground potential caused by the impedances of the annular conductor layers 19 and 40.

Figure 4A:
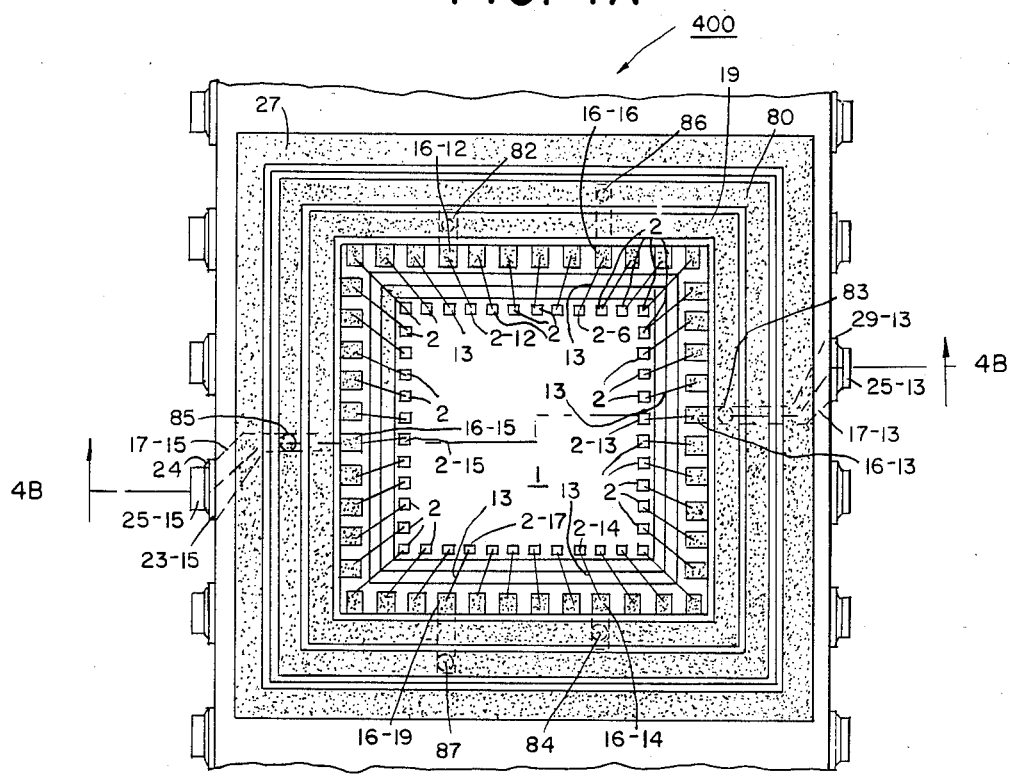
FIG. 4A is a plan view of a fourth preferred embodiment of the present invention with a cap removed.
Figure 4B:
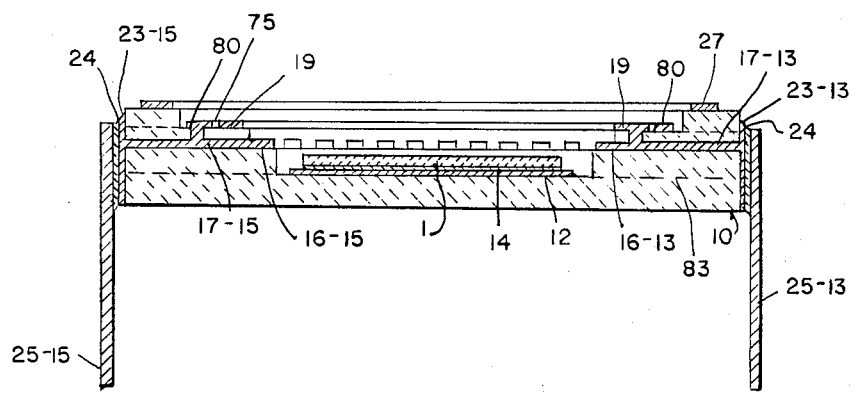
FIG. 4B is a cross-sectional view taken along a line A—A' in FIG. 4(A)

FIGS. 4A and 4B show a fourth preferred embodiment of the present invention. The semiconductor integrated circuit device often necessitates two kinds of power supply voltages $V_1$ and $V_2$ ($V_1 \neq V_2$) besides the ground potential. To that end, the semiconductor integrated circuit device 400 shown in FIGS. 4A and 4B is provided with an additional annular conductive layer 80 around the annular conductive layer 19. The annular conductive layers 19 and 80 are applied with the power supply voltages $V_1$ and $V_2$, respectively. The $V_1$ voltage annular conductor layer 19 is connected via three through-holes 82 to 84 to three connection terminals 16-12 to 16-14, respectively. These connection terminals 16-12 to 16-14 are respectively connected to the $V_1$ voltage electrodes 2-12 to 2-14 of the semiconductor element 1 through the bonding wires 13. One connection terminal 16-13 is connected via an internal wiring layer 17-13 to a side surface metallized layer 23-13 of the base body 10. A $V_1$ voltage external lead 25-13 is connected to the side surface metallized layer 23-13 with brazing material 24. Accordingly, the $V_1$ power supply voltage is applied to three electrodes 2-12 to 2-14 through one external lead 25-13, respectively.

The $V_2$ voltage annular conductive layer 80 is connected via three through-holes 85 to 87 to three connection terminals 16-15 to 16-17, respectively. These connection terminals 16-15 to 16-17 are respectively connected to the $V_2$ voltage electrodes 2-15 to 2-17 through the bonding wires 13. The connection terminal 16-15 is connected through an internal wiring layer 17-15 to a side surface metallized layer 23-15 to which a $V_2$ voltage external lead 25-15 is connected. Accordingly, the $V_2$ power supply voltage is applied to three electrodes 2-15 to 2-17 through one external lead 25-15, respectively.

The semiconductor integrated circuit device 400 shown in FIGS. 4A and 4B may have the grounding annular conductor layer 40 in accordance with the teaching in FIG. 2, and further the resistance of the respective annular conductor layers can be lowered according to the teaching in FIG. 3. If only one power supply voltage is applied to the semiconductor chip 1, the external lead 25-15 electrically connected to the annular conductive layer 80 may be used as a ground terminal.

Figure 5A:
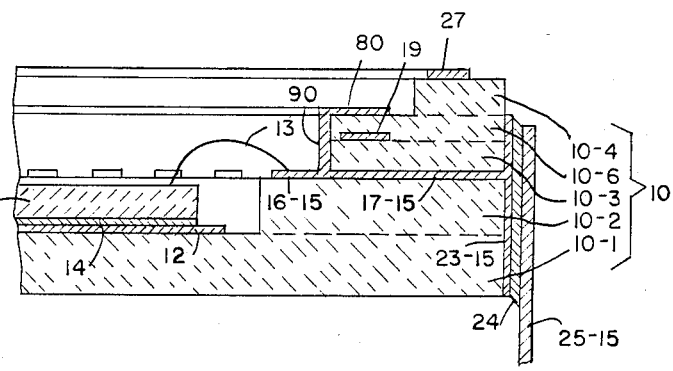
FIG. 5A is a partial cross-sectional view showing a first example of modification of the fourth preferred embodiment shown in FIGS. 4A and 4B.
Figure 5B:
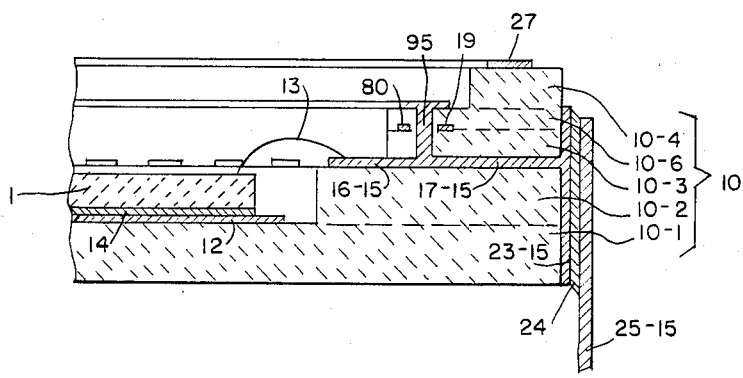
FIG. 5B is a partial cross-sectional view of a second example of modification of the same.

Two annular conductor layers 19 and 80 may be disposed on the different planes from each other to reduce the area of the entire package. To this end, an additional alumina ceramic sheet 10-6 having the annular conductive layer 80 formed on its top surface is interposed between the ceramic sheets 10-3 and 10-4 as shown in FIG. 5A and 5B. In this case, the connection between the annular conductor layer 80 and the connection terminals 16-15 to 16-17 is performed by making use of side surface metallized layers (one layer 90 being shown in FIG. 5A) or through-holes (one through-hole 95 being shown in FIG. 5B) penetrating through the other annular conductive layer 19 as insulated therefrom as shown in FIG. 5B. The connection between the annular conductor layer 19 and the connection terminal 16-13 (not shown in FIGS. 5A and 5B) also utilize side surface metallized layers or through-holes.

It is apparent that the present invention should not be limited to the above-described embodiments and many modifications can be made without departing from the spirit of the present invention. For instance, the present invention can be applicable to the semiconductor integrated circuit device of the QIP (Quadle In-line Package) type or the SIP (Single In-line Package) type. In addition, the materials of the insulator base 10, external leads 25, the lid 70, the respective metallized layer, etc. are not limited to those shown in the above-described embodiments.

As described in detail above, according to the present invention, the number of electrodes of the semiconductor chip for power supply use and/or for grounding use can be increased without increasing the number of external leads of the package.

What is claimed is:

1. A semiconductor device comprising an insulating body constituted of first, second, third and fourth insulating sheets laminated into a unitary structure, said second insulating sheet having a first hole to provide a first horizontal surface on said first insulating sheet, said third insulating sheet having a second hole larger than said first hole to provide a second horizontal surface of an annular shape on said second insulating sheet, said fourth insulating sheet having a third hole larger than said second hole to provide a third horizontal surface of an annular shape on said third insulating sheet, a semiconductor chip mounted on said first horizontal surface and having a plurality of first electrodes supplied with the same voltage and a plurality of second electrodes, a plurality of first and second connection terminals made of metallized layers and formed on said second horizontal surface separately from each other, means for connecting said first electrodes of said semiconductor chip to said first connection terminals, means for connecting said second electrodes of said semiconductor chip to said second terminals, a first metallized wiring layer and a plurality of second metallized wiring layers buried in said insulating body, one end of said first metallized wiring layer being connected to one of said first connection terminals and one end of each of said second metallized wiring layers being respectively connected to said second connection terminals, the other ends of said first and second metallized wiring layers extending to an exposed surface of said insulating body, a first external lead attached to the other end of said first metallized wiring layer, a plurality of second external leads attached to the respective other ends of said second metallized wiring layers, a conductive layer formed on said third horizontal surface and extending along said third horizontal surface to provide an annular conductive layer, a plurality of conductive paths connecting said first connection terminals to said annular conductive layer, and a lid attached to said insulating body and closing said first, second and third holes thereby to provide a sealed space containing said semiconductor chip therein.

2. The semiconductor device as claimed in claim 1, wherein at least one of said conductive paths comprises a metallized layer extending from at least one of said first connection terminals to said annular conductive layer.

3. The semiconductor device as claimed in claim 1, wherein at least one of said conductive paths comprises a conductive through-hole penetrating said second insulating sheet to connect one of said first connection terminals to said annular conductive layer.

4. The semiconductor device as claimed in claim 1, further comprising an additional conductive layer formed on said third horizontal surface and extending along said annular conductive layer to provide a second annular conductive layer, a plurality of third connection terminals made of metallized layers and formed on said second horizontal surface separately from said first and second connection terminals, a third metallized wiring layer buried in said insulating body and having one end connected to one of said third connection terminals and the other end extended to the exposed surface of said insulating body, a third external lead attached to the other end of said third metallized wiring layer, and a plurality of additional conductive paths connecting said third connection terminals to said second annular conductive layer, said semiconductor chip further having a plurality of third electrodes supplied with a second voltage different from the voltage supplied to said first electrodes, said third electrodes of said semiconductor chip being connected to said third connection terminals.

5. The semiconductor device as claimed in claim 1, further comprising a fifth insulating sheet inserted between said first and second insulating sheets and having a fourth hole smaller than said first hole, said fourth hole providing said first horizontal surface on said first insulating sheet, said first hole providing a fourth horizontal surface of an annular shape on said fifth insulating sheet, an additional conductive layer formed on said fourth horizontal surface and extending along said fourth horizontal surface to provide a second annular conductive layer, a plurality of third connection terminals formed on said second horizontal surface separately from said first and second connection terminals, a plurality of additional conductive paths connecting said third connection terminals to said second annular conductive layer, a third external lead attached to said insulating body, and a third metallized wiring layer connecting said third external lead to one of said third connection terminals, said semiconductor chip further having a plurality of third electrodes supplied with a second voltage different from the voltage supplied to said first electrodes, said third electrodes of said semiconductor chip being connected to said third metallized connection terminals, respectively.

6. A semiconductor device comprising a package body of insulating material having a first horizontal surface of a rectangular shape, a rising wall provided along the periphery of said first horizontal surface and a second horizontal surface extending from the edge of said rising wall in parallel to said first horizontal surface, a semiconductor chip mounted on said first horizontal surface and having a plurality of first electrode pads supplied with the same potential and a plurality of second electrode pads, a plurality of first connection terminals and a plurality of second connection terminals provided on said second horizontal surface separately from one another, means for connecting said first connection terminals to said first electrode pads of said semiconductor chip, means for connecting said second connection terminals to said second electrode pads of said semiconductor chip, an annular metallized conductor buried completely in said insulative package body along said rising wall to thereby surround said first horizontal surface, a plurality of conductive layers having one end respectively connected to said first connection terminals and the other end connected to said annular conductor, a first external lead terminal attached to said insulative package body, a first internal wiring layer connecting said first external lead terminal to one of said first connection terminals, a plurality of second external lead terminals attached to said insulative package body, and a plurality of second internal wiring layers connecting said second external lead terminals to said second connection terminals, respectively.

7. The semiconductor device as claimed in claim 6, wherein said annular conductor has a plurality of projected portions each having an end portion exposed at said rising wall and each of said conductive layers is made of metallized layer formed on said rising wall and extending from the end portion of each projected portion of said annular conductor to each of said first connection terminals.

8. A semiconductor device comprising a body of insulating material having a lower horizontal surface, a first middle horizontal surface of a rectangular shape, a second middle horizontal surface of an annular shape, a first internal vertical surface coupling said first and second middle horizontal surfaces, a third middle horizontal surface of an annular shape, a second internal vertical surface coupling said second and third middle horizontal surface, an upper horizontal surface of an annular shape, a third internal vertical surface coupling said third middle horizontal surface and said upper horizontal surface, and an outside vertical surface coupling said upper and lower horizontal surfaces, a semiconductor chip mounted on said first middle horizontal surface of said insulating body and having a plurality of first electrodes supplied with the same voltage and a plurality of second electrodes, a plurality of first connection terminals formed on said second middle horizontal surface of said insulating body separately from each other, a plurality of second connection terminals formed on said second middle surface of said insulating body separately from each other and from said first connection terminals, a plurality of first connection paths connecting each of said first connection terminals and each of said first electrodes of said semiconductor chip, respectively, a plurality of second connection paths connecting each of said second connection terminals and each of said second electrodes of said semiconductor chip, a first external lead and a plurality of second external leads each attached to said insulating body separately from one another, a first internal wiring layer buried in said insulating body and connecting said first external lead to at least one of said first connection terminals, a plurality of second internal wiring layers buried in said insulating body and connecting each of said second external leads to each of said second connection terminals, respectively, a conductive layer formed along said third middle horizontal surface of said insulating body to provide an annular conductor, a plurality of conductive paths connecting each of said first connection terminals to said annular conductor, respectively, and a lid attached to said upper horizontal surface of said insulating body to seal said semiconductor chip.

9. A semiconductor device comprising an insulating body constituted of first, second, third and fourth insulating sheets laminated into a unitary structure, said second insulating sheet having a first hole to thereby provide a first horizontal surface on said first insulating sheet, said third insulating sheet having a second hole larger than said first hole to thereby provide a second horizontal surface of an annular shape on said second insulating sheet, said fourth insulating sheet having a third hole larger than said second hole to thereby provide a third horizontal surface of an annular shape on said third insulating sheet, a semiconductor chip mounted on said first horizontal surface and having a plurality of first electrodes each supplied with a first voltage, a plurality of second electrodes each supplied with a second voltage different from said first voltage and a plurality of third electrodes, a plurality of first metallized connection terminals formed on said second horizontal surface and connected to said first electrodes of said semiconductor chip, respectively, a plurality of second metallized connection terminals formed on said second horizontal surface and connected to said second electrodes of said semiconductor chip, respectively, a plurality of third metallized connection terminals formed on said second horizontal surface and connected to said third electrodes of said semiconductor chip, respectively, a first external lead attached to said insulating body, a second external lead attached to said insulating body, a plurality of third external leads attached to said insulating body, a first metallized wiring layer buried in said insulating body and connecting said first external lead to at least one of said first connection terminals, a second metallized wiring layer buried in said insulating body and connecting said second external lead to at least one of said second metallized connection terminals, a plurality of third metallized wiring layers buried in said insulating body and connecting said third external leads to said third metallized connection terminals, respectively, a first conductive layer formed along said third horizontal surface to provide a first annular conductive layer, a second conductive layer buried between said first and second insulating sheets along the periphery of said first horizontal surface to provide a second annular conductive layer, a plurality of first conductive paths connecting said first metallized connection terminals to said first annular conductive layer, a plurality of second conductive paths connecting said second metallized connection terminals to said second annular conductive layer, and a lid attached to said insulating body and closing said first, second and third holes thereby to provide a sealed space containing said semiconductor chip therein.

10. The semiconductor device as claimed in claim 9, wherein said first voltage is a power supply voltage and said second voltage is a ground voltage.

11. A semiconductor device comprising an insulating body constituted of first, second, third and fourth insulating sheets laminated into a unitary structure, said second insulating sheet having a first hole to thereby provide a first horizontal surface on said first insulating sheet, said third insulating sheet having a second hole larger than said first hole to thereby provide a second horizontal surface of an annular shape on said second insulating sheet, said fourth insulating sheet having a third hole larger than said second hole to thereby provide a third horizontal surface of an annular shape on said third insulating sheet, a semiconductor chip mounted on said first horizontal surface and having a plurality of first electrodes each supplied with a first voltage, a plurality of second electrodes each supplied with a second voltage different from said first voltage and a plurality of third electrodes, a plurality of first metallized connection terminals formed on said second horizontal surface and connected to said first electrodes of said semiconductor chip, respectively, a plurality of second metallized connection terminals formed on said second horizontal surface and connected to said second electrodes of said semiconductor chip, respectively, a plurality of third metallized connection terminals formed on said second horizontal surface and connected to said third electrodes of said semiconductor chip, respectively, a first external lead attached to said insulating body, a second external lead attached to said insulating body, a plurality of third external leads attached to said insulating body, a first metallized wiring layer buried in said insulating body and connecting said first external lead to at least one of said first connection terminals, a second metallized wiring layer buried in said insulating body and connecting said second external lead to at least one of said second metallized connection terminals, a plurality of third metallized wiring layers buried in said insulating body and connecting said third external leads to said third metallized connection terminals, respectively, a first conductive layer formed along said third horizontal surface to provide a first annular conductive layer, a second conductive layer formed on said third horizontal surface along said first annular conductive layer to provide a second annular conductive layer, a plurality of first conductive paths connecting said first metallized connection terminals to said first annular conductive layer, a plurality of second conductive paths connecting said second metallized connection terminals to said second annular conductive layer, and a lid attached to said insulating body and closing said first, second and third holes thereby to provide a sealed space containing said semiconductor chip therein.

12. The semiconductor device as claimed in claim 11, wherein each of said first and second conductive paths is formed of a conductive through-hole.

13. A semiconductor device comprising an insulating body constituted of first, second, third, fourth and fifth insulating sheets laminated into a unitary structure, said second insulating sheet having a first hole to thereby provide a first horizontal surface on said first insulating sheet, said third insulating sheet having a second hole larger than said first hole to thereby provide a second horizontal surface of an annular shape on said second insulating sheet, said fourth insulating sheet having a third hole larger than said second hole to thereby provide a third horizontal surface of an annular shape on said third insulating sheet, said fifth insulating sheet having a fourth hole larger than said third hole to thereby provide a fourth horizontal surface of an annular shape on said fourth insulating sheet, a semiconductor chip mounted on said first horizontal surface and having a plurality of first electrodes each supplied with a first voltage, a plurality of second electrodes each supplied with a second voltage different from said first voltage and a plurality of third electrodes, a plurality of first metallized connection terminals formed on said third horizontal surface and connected to said first electrodes of said semiconductor chip, respectively, a plurality of second metallized connection terminals formed on said third horizontal surface and connected to said second electrodes of said semiconductor chip, respectively, a plurality of third metallized connection terminals formed on said third horizontal surface and connected to said third electrodes of said semiconductor chip, respectively, a first external lead attached to said insulating body, a second external lead attached to said insulating body, a plurality of third external leads attached to said insulating body, a first metallized wiring layer buried in said insulating body and connecting said first external lead to at least one of said first connection terminals, a second metallized wiring layer buried in said insulating body and connecting said second external lead to at least one of said second metallized connection terminals, a plurality of third metallized wiring layers buried in said insulating body and connecting said third external leads to said third metallized connection terminals, respectively, a first conductive layer formed along said second horizontal surface to provide a first annular conductive layer, a second conductive layer formed along said fourth horizontal surface to provide a second annular conductive layer, a plurality of first conductive paths connecting said first metallized connection terminals to said first annular conductive layer, a plurality of second conductive paths connecting said second metallized connection terminals to said second annular conductive layer, and a lid attached to said insulating body and closing said first, second, third and fourth holes thereby to provide a sealed space containing said semiconductor chip therein.

* * * * *